(12) United States Patent
Matsunaga

(10) Patent No.: US 6,942,493 B2
(45) Date of Patent: Sep. 13, 2005

(54) CONNECTOR STRUCTURE FOR CONNECTING ELECTRONIC PARTS

(75) Inventor: Hitoshi Matsunaga, Tokyo (JP)

(73) Assignee: Unitechno Inc., Tokyo (JP)

( * ) Notice: Subject to any disclaimer, the term of this patent is extended or adjusted under 35 U.S.C. 154(b) by 0 days.

(21) Appl. No.: 10/292,095

(22) Filed: Nov. 12, 2002

(65) Prior Publication Data

US 2003/0092294 A1 May 15, 2003

(30) Foreign Application Priority Data

Nov. 13, 2001 (JP) ..................................... 2001-346852

(51) Int. Cl.⁷ ............................................. H01R 12/00
(52) U.S. Cl. ...................................................... 439/66
(58) Field of Search ............................. 439/66, 67, 591

(56) References Cited

U.S. PATENT DOCUMENTS

| | | | | |
|---|---|---|---|---|
| 6,027,346 A | * | 2/2000 | Sinsheimer et al. | 439/66 |
| 6,033,235 A | * | 3/2000 | Ikeya | 439/71 |
| 6,210,173 B1 | * | 4/2001 | Matsunaga | 439/66 |
| 6,383,005 B2 | * | 5/2002 | Ho et al. | 439/331 |

FOREIGN PATENT DOCUMENTS

| JP | H06-11541 | 1/1994 |
|---|---|---|
| JP | H08-115777 | 5/1996 |
| JP | 11-07076 | 1/1999 |
| JP | 2000-188162 | 7/2000 |

\* cited by examiner

Primary Examiner—Phuong Dinh
(74) Attorney, Agent, or Firm—RatnerPrestia

(57) ABSTRACT

A connector structure comprising a first connecting layer and a second connecting layer. The first connecting layer consists of an electrically insulated portion and a plurality of electrical conductive portions each having first and second surfaces opposing to each other. The first surfaces of the electrically conductive portions are to respectively receive and be held in electrical contact with the terminals of the first electric part. The second connecting layer consists of an electrically insulated sheet and a plurality of electrically conductive paths respectively passing through the electrically insulated sheet obliquely. Each of the electrically conductive paths has first and second ends opposing each other. The second ends of the electrically conductive paths are to respectively receive and be held in electrical contact with the terminals of the second electronic part.

13 Claims, 7 Drawing Sheets

CONNECTOR STRUCTURE FOR CONNECTING ELECTRONIC PARTS

This application claims priority to Japanese Patent Application No. 2000-346852, filed on Nov. 13, 2001.

BACKGROUND OF THE INVENTION

1. Field of the Invention

The present invention relates to a connector structure for electrically connecting electronic parts for testing the electronic parts, and more specifically to a connector structure for connecting an integrated circuit and an electronic circuit for testing the integrated circuit.

2. Description of the Related Art

The connector structure of this type is utilized to connect an integrated circuit having a plurality of IC terminals with an electronic circuit having a plurality of electronic pads respectively paired with the IC terminals of the integrated circuit to test the electronic performances of the integrated circuit before it is put on the market. The word "an integrated circuit" refers here to, for example, a semiconductor chip wafer, a semiconductor integrated circuit chip, and a semiconductor integrated circuit chip package. In order to test the integrated circuit, IC terminals of the integrated circuit are to be electrically connected with the electronic pads of the electronic circuit, respectively.

One typical example of the conventional connector structure, hereinlater referred to as "a first conventional connector structure", is disclosed in the Japanese Patent Laid-Open Publication No. H06-11541. The fist conventional connector structure disclosed herein is exemplified and shown in FIG. 6 as comprising a sheet 733 for mounting a bump 731 of a semiconductor chip 732 thereon, a supporting portion 734 for supporting the semiconductor chip 732, an internal pad 735 electrically connected with the semiconductor chip 732 through the sheet 733, a board 738 equipped with a connecting pad 737 for electrically connecting the internal pad 735 with input/output terminals 736, a base socket 739 equipped with the input/output terminals 736, and an upper socket 744 for electrically insulating the semiconductor chip 732, wherein the sheet 733 is made of an anisotronic material which conducts electricity only with respect to a vertical direction D and the supporting portion 734 is fixed to the sheet 733. The first conventional connector structure thus constructed enables to repeatedly test various types of integrated circuit.

The first conventional connector structure, however, encounters a drawback that the first conventional connector structure is electrically conductive only with respect to the vertical direction D. This leads to the fact that the first conventional connector structure may not be able to test an integrated circuit complex in shape and diverse in structure, which is commonly used.

Conventional connector structures, in general, use contact pins and springs. The contact pins and springs are large units, thereby increasing the inductance and parasitic capacitance inherent in the conventional connector structure. Another example of the conventional connector structure, hereinlater referred to as "a second conventional connector structure", disclosed in the Japanese Patent Laid-Open Publication No. H08-115777 aims at solving the problems of inductance and parasitic capacitance. The second conventional connector structure disclosed herein is exemplified and shown in FIG. 7 as comprising a print circuit board 811 having a plurality of conductive bodies 813 mounted thereon, a conductive rubber sheet 820 having a plurality of conductive wires 822 passing therethrough, and an electrode board 827 having a plurality of electrodes 831. The conductive wires 822 have first ends respectively contacted with the electrodes 831 and second ends respectively contacted with the conductive bodies 813.

The second conventional connector structure has another drawback that the second conventional connector structure is required to be held under a high pressure to ensure electric connection between the electrodes 831 and the conductive bodies 813 through the conductive wires 822. The present invention is made with a view to overcoming the previously mentioned drawbacks inherent in the conventional connector structure.

SUMMARY OF THE INVENTION

It is therefore an object of the present invention to provide a connector structure which is simple in structure but enables a reliable electrical connection between first and second electronic parts while eliminating the need to hold the connector structure under a high pressure.

It is another object of the present invention to provide a connector structure which makes it possible to test an integrated circuit complex in shape and diverse in structure.

In accordance with a first aspect of the present invention, there is provided a connector structure for electrically connecting first and second electric parts each having a plurality of terminals which can be electrically connected when the electronic parts are arranged with the terminals facing and spaced apart from each other, comprising: a first connecting layer consisting of an electrically insulated portion and a plurality of electrically conductive portions each having first and second surfaces opposing to each other, the first surfaces of the electrically conductive portions being to respectively receive and be held in electrical contact with the terminals of the first electronic part; a second connecting layer consisting of an electrically insulated sheet and a plurality of electrically conductive paths respectively passing through the electrically insulated sheet obliquely, the electrically conductive paths having respectively first and second ends opposing to each other, the second ends of the electrically conductive paths being to be respectively held in electrical contact with the terminals of the second electronic part. The aforesaid second surfaces of the electrically conductive portions of the first connecting layer respectively are held in electrical contact with the first ends of the electrically conductive paths forming part of the second connecting layer. The diameter of each of the first surfaces of the electrically conductive portions forming part of the first connecting layer may be in the range of 80% to 150% of that of respective one of the terminals of the first electronic part to ensure electrical connection between the first and second electronic parts.

In the aforesaid connector structure, the electrically insulated portion forming part of the first connecting layer may be breathable and flexible. Preferably, the electrically insulated portion forming part of the first connecting layer may be in the form of a mesh structure. Furthermore, the electrically insulated sheet forming part of the second connecting layer may be made of synthetic resin or synthetic rubber. More preferably, the thickness of the electrically insulated sheet forming part of the second connecting layer should be in the range of 0.3 to 1.0 mm.

In accordance with a second aspect of the present invention, there is provided a connector structure in which each of the first surfaces of the electrically conductive portions forming part of the first connecting layer is shaped so as to fittedly receive thereon and be held in electrical contact with a terminal of the first electronic part. The shape may be any one of a plane shape, a spherical concave shape, a conical concave shape, a crown shape, and a spherical shape.

In accordance with a third aspect of the present invention, there is provided a connector structure, in which the first connecting layer is removably mounted on the second connecting layer. The first ends of the electrically conductive paths forming part of the second connecting layer may be designed to be able to respectively receive thereon and be held in electrical contact with the terminals of the first electronic part when the first connecting layer is removed. The first ends of the electrically conductive paths may be aligned and spaced apart from one another with respect to a first direction and a second direction perpendicular to the first direction so as to be respectively held in electrical contact with the terminals of the second electronic part.

Preferably, the first connecting layer is replaceable. The first connecting layer may be replaceable with a first connecting layer comprising electrically conductive portions having first surfaces in the form of shapes so as to fittedly receive and be held in electrical contact with the terminals of the first electronic part.

BRIEF DESCRIPTION OF THE DRAWINGS

The features and advantages of the connector structure according to the present invention will be more clearly understood from the following description taken in conjunction with the accompanying drawings in which.

DESCRIPTION OF THE PREFERRED EMBODIMENTS

Figure 1:
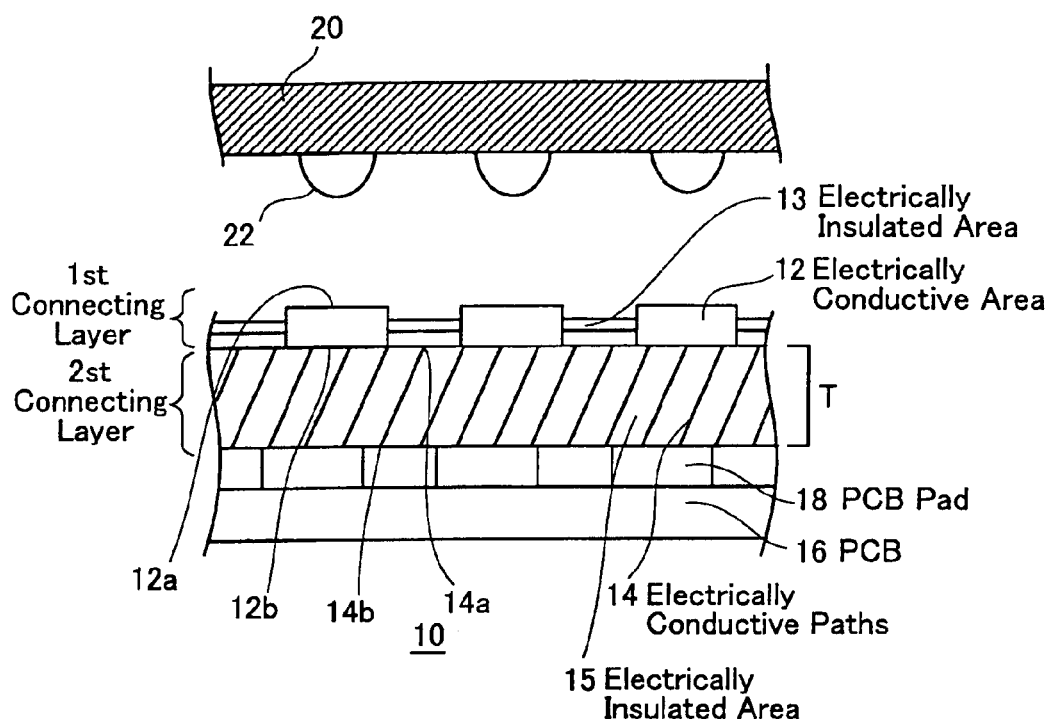
FIG. 1 is a cross-sectional view of a first preferred embodiment of a connector structure according to the present invention.

The preferred embodiments of the connector structure according to the present invention will be described hereinafter with reference to the drawings shown in FIGS. 1 to 5. Throughout the following detailed description, similar reference characters refer to similar elements in all figures of the drawings.

Figure 2:
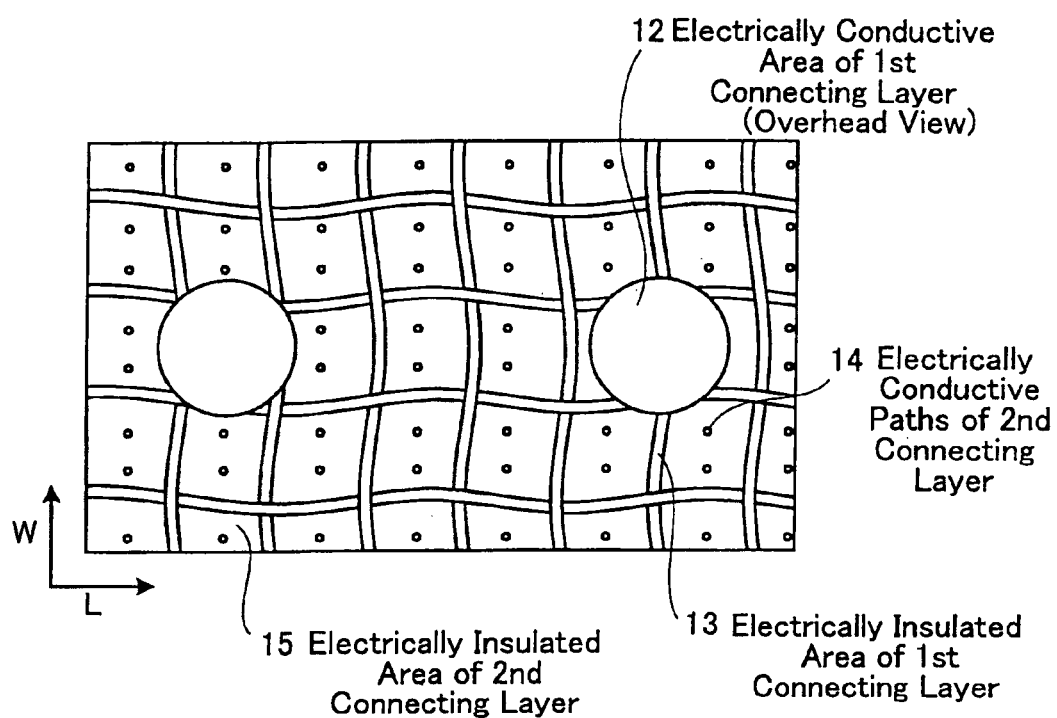
FIG. 2 is a top view of the connector structure shown in FIG. 1.
Figure 3:
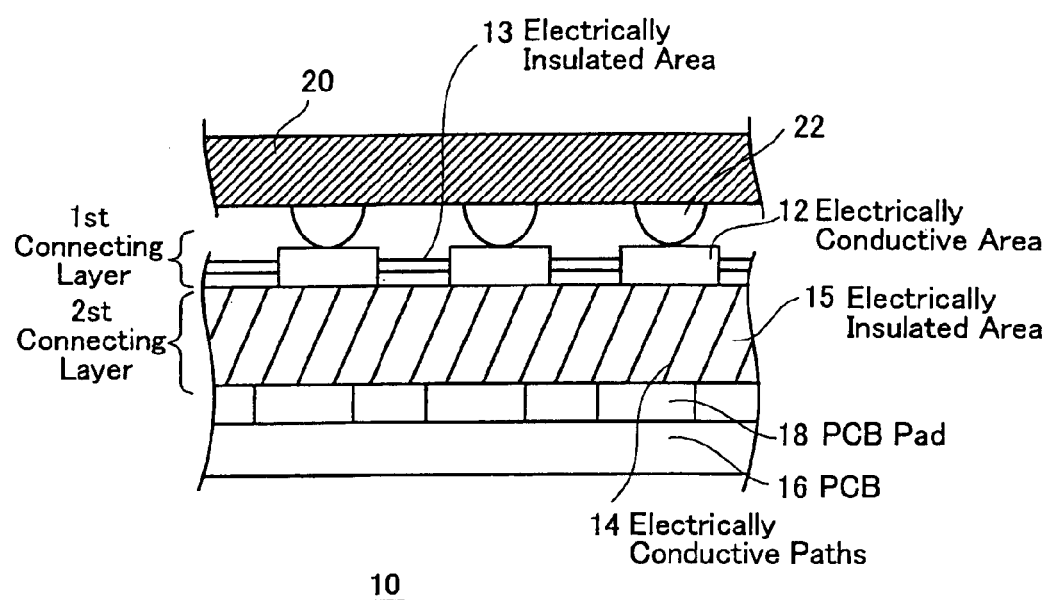
FIG. 3 illustrates the connector structure shown in FIG. 1 with a first electronic part and a second electronic part having the connector structure intervene therebetween and being urged toward each other.
Figure 4:
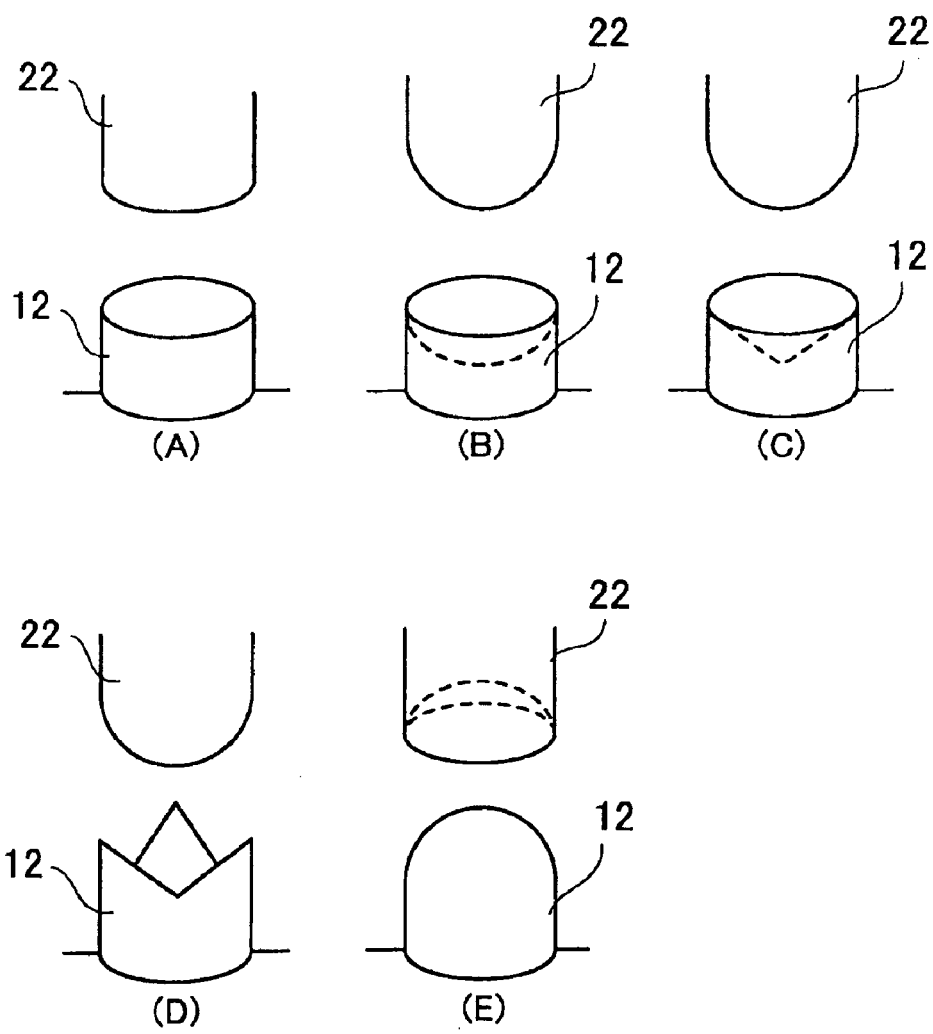
FIG. 4(A) is a perspective view showing a plane-shaped first surface of the electrically conductive portion of the first connecting layer forming part of a second preferred embodiment of the connector structure according to the present invention.
FIG. 4(B) is a perspective view showing a spherical concave-shaped first surface of the electrically conductive portion of the first connecting layer forming part of a second preferred embodiment of the connector structure according to the present invention.
FIG. 4(C) is a perspective view showing a conical concave-shaped first surface of the electrically conductive portion of the first connecting layer forming part of a second preferred embodiment of the connector structure according to the present invention.
FIG. 4(D) is a perspective view showing a crown-shaped first surface of the electrically conductive portion of the first connecting layer forming part of a second preferred embodiment of the connector structure according to the present invention.
FIG. 4(E) is a perspective view showing a spherical-shaped first surface of the electrically conductive portion of the first connecting layer forming part of a second preferred embodiment of the connector structure according to the present invention.

Referring now to FIGS. 1 to 3 of the drawings, there is shown a first preferred embodiment of the connector structure 10 according to the present invention.

The first preferred embodiment of the connector structure 10 is adapted to electrically connect a first electronic part 16 and a second electronic part 20. The first preferred embodiment of the connector structure 10 is shown in FIG. 1 as comprising a first connecting layer and a second connecting layer. The first electronic part 16 has a plurality of terminals 18, and the second electronic part 20 has a plurality of terminals 22. The first and second electronic parts 16, 20 can be electrically connected when the first and second electronic parts 16, 20 are arranged with the terminals 18, 22 facing and spaced apart from each other and urged toward each other as shown in FIG. 3. Preferably, the first electronic part 20 may be, for example, an integrated circuit, hereinlater simply referred to as "IC", and the terminals 22 of the first electronic part 20 may be, for example, IC terminals. More specifically, the IC may be, for example, Ball Grid Array, Fine-pitch Ball Grid Array, Land Grid Array, and Chip Size Package, hereinlater simply referred to as "BGA", "FBGA", "LGA", and "CSP", respectively. The second electronic part 16 may be, for example, a print circuit board, hereinlater simply referred to as "PCB", and the terminals 18 of the second electronic part 16 may be, for example, PCB pads.

The first connecting layer consists of an electrically insulated portion 13 and a plurality of electrically conductive portions 12. Each of the electrically conductive portions 12 has respectively first and second surfaces 12a, 12b opposing to each other. The first surfaces 12a of the electrically conductive portions 12 are to respectively receive and be held in electrical contact with the terminals 22 of the first electronic part 20, for example, IC terminals.

The second connecting layer consists of an electrically insulated sheet 15 and a plurality of electrically conductive paths 14 respectively passing through the electrically insulated sheet 15 obliquely. Each of the electrically conductive paths 14 has first and second ends 14a, 14b opposing to each other, respectively. The second ends 14b of the electrically conductive paths 14 are to be respectively held in electrical contact with the terminals 18 of the second electronic part 16, for example, PCB pads. The second surfaces 12b of the electrically conductive portions 12 forming part of the first connecting layer are adapted to be respectively held in electrical contact with the first ends 14a of the electrically conductive paths 14 forming part of the second connecting layer. Preferably, the diameter of each of the first surfaces 12a of the electrically conductive portions 12 forming part of the first connecting layer should be in the range of 80% to 150% of that of respective one of the terminals 22 of the first electronic part 20 in consideration of manufacturing tolerance so that the first surfaces 12a of the electrically conductive portions 12 forming part of the first connecting layer can reliably receive and be held in electric contact with the respective terminals 22 of the first electronic part 20 to ensure electrical connection between the first and second electronic parts 16, 20. Preferably, the second connecting layer may be a sheet such as, for example, GB Matrix, produced by Shin-Etsu Polymer Co., Ltd.

The first connecting layer is processed under suction at the time of manufacturing process, especially, while the first connecting layer is mounted on the second connecting layer. The first connecting layer is often deviated from a predetermined position or, at worst, vacuumed off unless the first connecting layer is made breathable and flexible enough to withstand the suction. This leads to the fact that the electrically insulated portion 13 is required to be in the form of a breathable and flexible structure as shown in FIG. 2 to a degree that the electrically insulated portion 13 could be easily molded and mounted on the second connecting layer at the time of manufacturing process. Preferably, the electrically insulated portion 13 may be made of polymer, such as, for example, resin, in the form of a mesh structure such as, for example, MCC (Mesh Circuit Connector) produced by NBC INC. Preferably, the electrically conductive portions 12 may be made of metal such as, for example, aluminum, copper, or silver. The first ends 14a of the electrically conductive paths 14 may be aligned and, for example, equidistantly spaced apart from one another with respect to a first direction W and a second direction L perpendicular to the first direction W.

The electrically insulated sheet 15 forming part of the second connecting layer may be made of synthetic resin or synthetic rubber. Preferably, the thickness T of the electrically insulated sheet 15 should be small so as to reduce the length of the electrically conductive paths 14. The thickness T of the electrically insulated sheet 15, however, is too small, for example, less than 30% of the total thickness of the connector structure, the electrically insulated sheet 15 will lose its restoring force. Preferably, the thickness T of the electrically insulated sheet 15 should be in the range of 0.3 to 1.0 mm.

The first embodiment of the connector structure according to the present invention comprising a first connecting layer consisting of an electrically insulated portion 13 and a plurality of electrically conductive portions 12, and a second connecting layer consisting of an electrically insulated sheet 15 and a plurality of electrically conductive paths 14 respectively passing through the electrically insulated sheet 15 obliquely whereby the first surfaces 12a of the electrically conductive portions 12 are to respectively receive and be held in electrical contact with the terminals 22 of the first electronic part 20, for example, IC terminals 22, and the diameter of each of the first surfaces 12a of the electrically conductive portions 12 forming part of the first connecting layer is in the range of 80% to 150% of that of respective one of the terminals 22 of the first electronic part 20 to ensure electrical connection between the first and second electronic parts 16, 20, is simple in structure but enables a reliable electrical connection between the first and second electronic parts while eliminating the need to hold the connector structure under a high pressure.

In order to attain the objects of the present invention, the above first embodiment of the connector structure may be replaced by a second embodiment of the connector structure, which will be described hereinlater.

Referring next to the drawings, in particular, to FIGS. 1, 2, 3, and 4, there is shown a second preferred embodiment of the connector structure according to the present invention. The second embodiment of the connector structure is similar to the first embodiment of the connect structure except for the fact that the first surfaces 12a of the electrically conductive portions 12 are shaped so as to fittedly receive and be held in electrical contact with the terminals 22 of the first electronic part 20. The constitution elements of the second embodiment of the connector structure entirely the same as those of the first embodiment of the connector structure will not be described but bear the same reference numerals and legends as those of the first embodiment of the connector structure 10 in FIG. 1 to avoid tedious repetition.

In the second embodiment of the connector structure, each of the first surfaces 12a of the electrically conductive portions 12 forming part of the first connecting layer is shaped so as to fittedly receive thereon and be held in electrical contact with a terminal 22 of the first electronic part 20. The first electronic part 20 may be complex in shape and diverse in structure. This means that the tip of a terminal 22 of the first electronic part 20 may be in the form of a shape such as, for example, a plane shape, a spherical shape, or a spherical concave shape. Each of the first surfaces 12a of the electrically conductive portions 12 forming part of the first connecting layer may be in the form of a shape so as to fittedly receive and be held in electrical contact with a terminal 22 of the first electronic part 20. Preferably, each of the first surfaces 12a of the electrically conductive portions 12 forming part of the first connecting layer may be in the form of a shape such as, for example, a plane shape, so as to fittedly receive thereon and be held in electrical contact with a terminal 22 having a plane-shaped tip as shown in FIG. 4(A). More preferably, each of the first surfaces 12a of the electrically conductive portions 12 forming part of the first connecting layer may be in the form of a shape such as, for example, a spherical concave shape, a conical concave shape, or a crown shape, so as to fittedly receive thereon and be held in electrical contact with a terminal 22 having a spherical-shaped tip as shown in FIGS. 4(B), 4(C), or 4(D). Furthermore, each of the first surfaces 12a of the electrically conductive portions 12 forming part of the first connecting layer may be in the form of a shape such as, for example, a spherical shape, so as to fittedly receive thereon and be held in electrical contact with a terminal 22 having a spherical concave-shaped tip as shown in FIG. 4(E).

The second embodiment of the connector structure according to the present invention, in which the first surfaces 12a of the electrically conductive portions 12 are shaped so as to fittedly receive and be held in electrical contact with the terminals 22 of the first electronic part 20 is simple in structure but enables a reliable electrical connection between first and second electronic parts while eliminating the need to hold the connector structure under a high pressure.

Furthermore, the shape of each of the first surfaces may include, for example, a plane shape, a spherical concave shape, a conical concave shape, a crown shape, or a spherical shape in accordance with the tip of the corresponding terminal 22 of the first electronic part 20. This leads to the fact that the second embodiment of the connector structure thus constructed makes it possible to test a first electronic part 20 having terminals 22 complex in shape and diverse in structure.

In order to attain the objects of the present invention, the above second embodiment of the connector structure may be replaced by a third embodiment of the connector structure, which will be described hereinlater.

Referring to FIGS. 1, 2, 3, and 5 of the drawings, there is shown a third preferred embodiment of the connector structure according to the present invention. The third embodiment of the connector structure according to the present invention is similar to the first embodiment of the connector structure except for the fact that the first connecting layer is removably mounted on the second connecting layer and the first ends of the electrically conductive paths 14 forming part of the second connecting layer are designed to be able to respectively receive thereon and be held in electrical contact with the terminals 22 of the first electronic part 20 when the first connecting layer is removed. The constitution elements of the third embodiment of the connector structure entirely the same as those of the first embodiment of the connector structure will not be described but bear the same reference numerals and legends as those of the first embodiment of the connector structure 10 in FIG. 1 to avoid tedious repetition.

In the third embodiment of the connector structure, the first connecting layer is removably mounted on the second connecting layer and the first ends of the electrically conductive paths 14 forming part of the second connecting layer are operative to respectively receive thereon and be held in electrical contact with the terminals 22 of the first electronic part 20 when the first connecting layer is removed.

Figure 5:
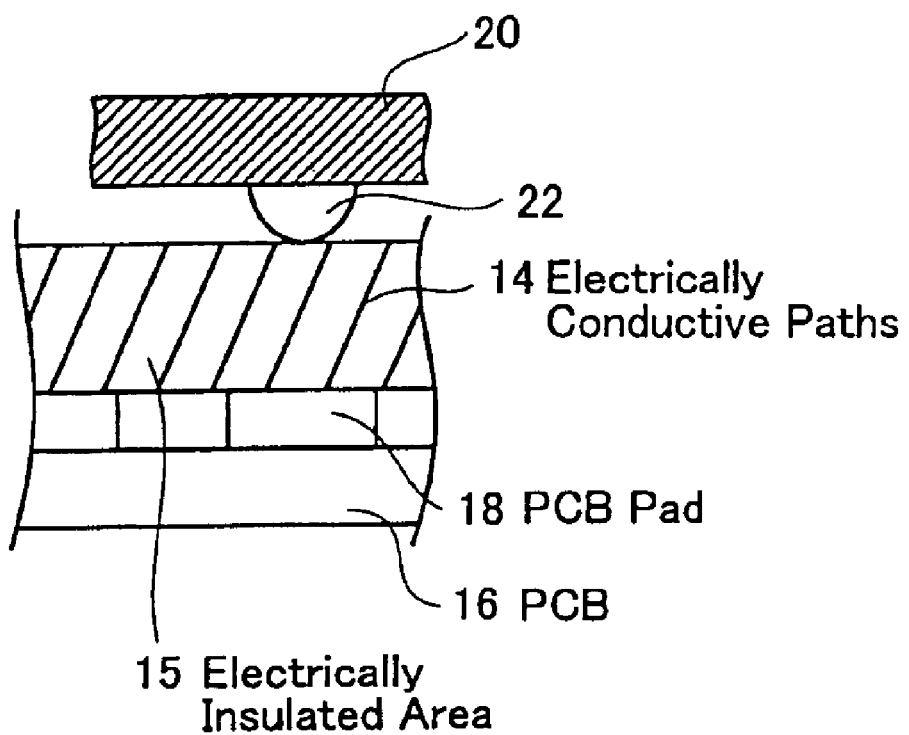
FIG. 5 is an enlarged fragmentary cross-sectional view of an electrically conductive portion of the first connecting layer forming part of a third preferred embodiment of the connector structure illustrating one terminal of the first electronic part deviated from a first end of an electrically conductive path of the second connecting layer.
Figure 6:
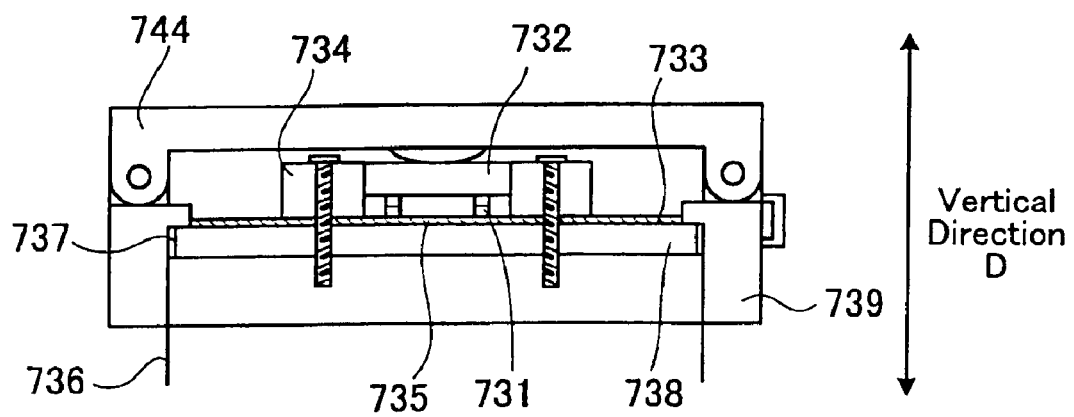
FIG. 6 is a cross-sectional view of a first conventional connector structure.
Figure 7:
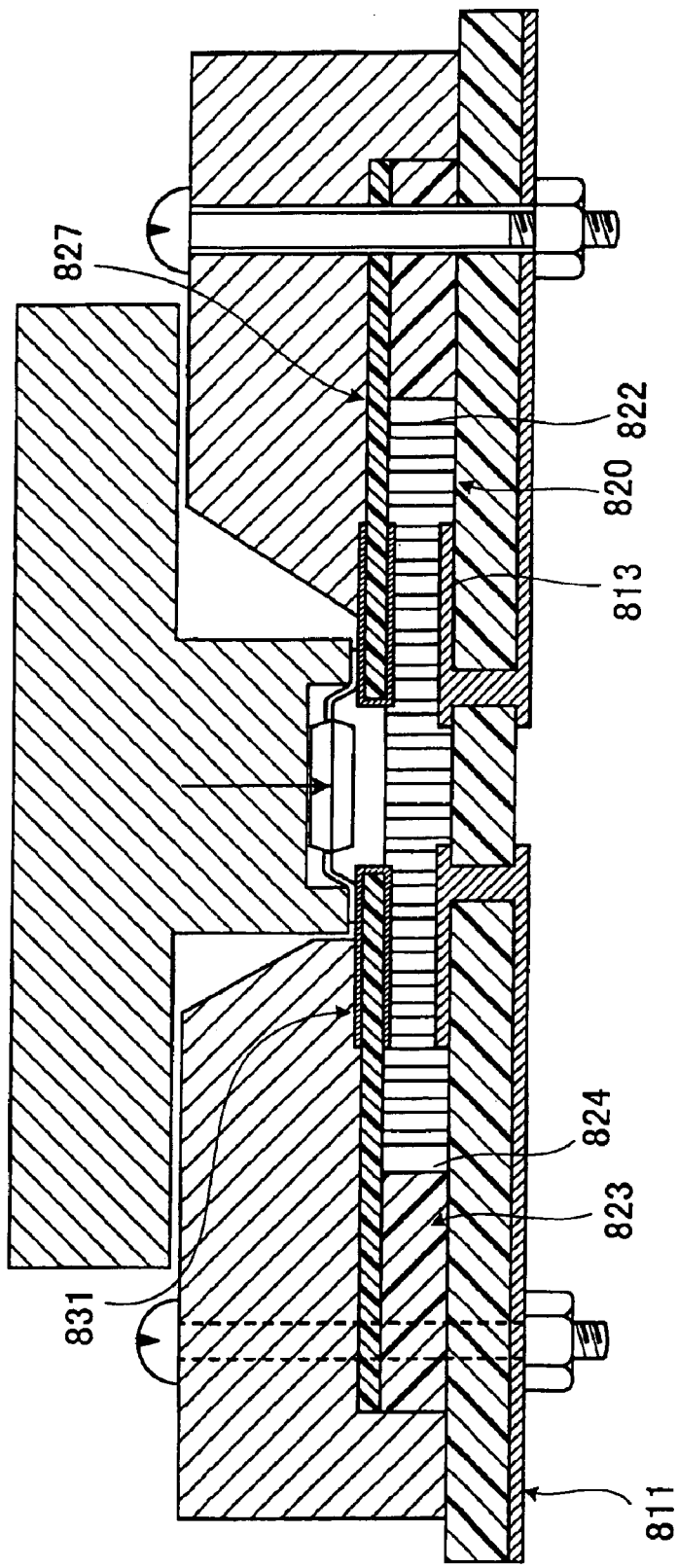
FIG. 7 is a cross-sectional view of a second conventional connector structure.

With the first connecting layer removed, the first ends 14a of the electrically conductive paths 14 forming part of the second connecting layer of the connecting structure according to the present invention are, in principle, designed to be able to receive thereon and be directly held in electrical contact with the terminals 22 of the first electronic part 20. This means that the first ends 14a of the electrically conductive paths 14 may be aligned and spaced apart from one another with respect to a first direction W and a second direction L perpendicular to the first direction W so as to be respectively held in electrical contact with the terminals 18 of the second electronic part 16. In reality, some tips of terminals 22 of the first electronic part 20, however, may fail to be held in contact with the respective first ends 14a of the electrically conductive paths 14, but in contact with the electrically insulated sheet 15 when the second connecting layer and the terminals 22 of the first electronic part 20 are arranged with the first ends 14a of the electrically conductive paths 14 and the terminals 22 facing and spaced apart from each other and urged toward each other as shown in FIG. 5 so that the first ends 14a of the electrically conductive paths 14 should be directly held in electrical contact with the terminals 22 of the first electronic part 20 because of the fact that the diameter of each of the tips of the terminal 22 is extremely small with respect to the distance at which one first end 14a of the electrically conductive paths 14 is aligned and spaced apart from another.

It is assumed that the first ends 14a of the electrically conductive paths 14 are aligned and equidistantly spaced apart from one another at a distance of, for example, 0.10±0.03 mm with respect to a first direction W and at a distance of, for example, 0.10±0.05 mm with respect to a second direction L perpendicular to the first direction W, the terminals 20 are, for example, spherical-shaped FBGA terminals, and the diameter of each of the FBGA terminals is around 0.45 mm. The tip diameter of the spherical-shaped FBGA terminal is approximately 15% of the diameter, i.e., around 0.07 mm because of the fact that the terminal is in the form of a spherical-shape. This means that the diameter of the tip of a terminal 22, i.e., the tip diameter of each of the FBGA terminals, which is around 0.07 mm, is extremely small with respect to the distance at which one first end 14a of the electrically conductive paths 14 is aligned and equi- distantly spaced apart from another, which is 0.10±0.03 mm with respect to the first direction W and 0.10±0.05 mm with respect to a second direction L, thereby making it possible for some tips of terminals 22 of the first electronic part 20 to fail to be held in contact with the respective first ends 14a of the electrically conductive paths 14, but in contact with the electrically insulated sheet 15 as shown in FIG. 5 when the first ends 14a of the electrically conductive paths 14 forming part of the second connecting layer are moved toward the first electronic part 20 to be directly held in electrical contact with the terminals 22 of the first electronic part 20.

The third embodiment of the connector structure which further comprises a first connecting layer consisting of an electrically insulated portion 13 and a plurality of electrically conductive portions 12 having first surfaces 12a designed to be able to respectively receive thereon and be held in electrical contact with the terminals 22 of the first electronic part 20, and second surfaces 12b to be respectively held in electrical contact with the first ends 14a of the electrically conductive paths 14 forming part of the second connecting layer, makes it possible for the first surfaces 12a of the electrically conductive portions 12 to respectively receive thereon and be held in electrical contact with the terminals 22 of the first electronic part 20 reliably, thereby ensuring electrical connection between first and second electronic parts while eliminating the need to hold the connector structure under a high pressure.

From the foregoing description, it is to be understood that the third embodiment of the connector structure which further comprises a first connecting layer consisting of an electrically insulated portion 13 and a plurality of electrically conductive portions 12 having first and second surfaces opposing to each other, the first surfaces 12a of the electrically conductive portions 12 being to respectively receive and be held in electrical contact with the terminals 22 of the first electronic part 20, in addition to the second connecting layer including the electrically conductive paths 14 having first ends designed to be able to respectively receive thereon and be held in electrical contact with the terminals 22 of the first electronic part 20 when the first connecting layer is removed, can reliably connect the first and second electronic parts while eliminating the need to hold the connector structure under a high pressure.

Furthermore, the third embodiment of the connector structure thus constructed makes it easy to for the first connecting layer to be replaced. As described earlier, the first electronic part 20 may be complex in shape and diverse in structure. Accordingly, the tip of a terminal 22 of the first electronic part 20 may be in the form of a shape such as, for example, a plane shape, a spherical shape, or a spherical concave shape.

The third embodiment of the connector structure thus constructed, the first connecting layer may be replaced with a first connecting layer comprising the electrically conductive portions 12 having first surfaces 12a in the form of a shape so as to fittedly receive and be held in electrical contact with the terminals 22 of the first electronic part 20. Preferably, each of the first surfaces 12a of the electrically conductive portions 12 forming part of the first connecting layer may be in the form of a shape such as, for example, a plane shape, so as to fittedly receive thereon and be held in electrical contact with a terminal 22 having a plane-shaped tip as shown in FIG. 4(A). More preferably, each of the first surfaces 12a of the electrically conductive portions 12 forming part of the first connecting layer may be in the form of a shape such as, for example, a spherical concave shape, a conical concave shape, or a crown shape, so as to fittedly receive thereon and be held in electrical contact with a terminal 22 having a spherical-shaped tip as shown in FIGS. 4(B), 4(C), or 4(D). Furthermore, each of the first surfaces 12a of the electrically conductive portions 12 forming part of the first connecting layer may be in the form of a shape such as, for example, a spherical shape, so as to fittedly receive thereon and be held in electrical contact with a terminal 22 having a spherical concave-shaped tip as shown in FIG. 4(E).

The third embodiment of the connector structure, in which the first connecting layer is replaceable with a first connecting layer comprising electrically conductive portions having first surfaces in the form of shapes so as to fittedly receive and be held in electrical contact with the terminals of the first electronic part, makes it possible to test a first electronic part 20 having terminals 22 complex in shape and diverse in structure.

As will be understood from the foregoing description, the connector structure according to the present invention is simple in structure but enables a reliable electrical connection between first and second electronic parts while eliminating the need to hold the connector structure under a high pressure. Furthermore, the connector structure according to the present invention, makes it possible to test an integrated circuit complex in shape and diverse in structure.

The many features and advantages of the invention are apparent from the detailed specification and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described, and accordingly, all suitable modifications and equivalents may be resorted to, falling with the scope of the invention.

What is claimed is:

1. A connector structure for electrically connecting first and second electronic parts each having a plurality of terminals which can be electrically connected when said electronic parts are arranged with said terminals facing and spaced apart from each other, comprising:
    a first connecting layer comprising a first electrically insulating portion having a top and a bottom surface opposing each other and plurality of electrically conductive portions supported in said first insulating portion each of said conductive portions having first and second surfaces also opposing each other, said first surface of each of said electrically conductive portions extending to at least said top surface of said first insulating portion and adapted to respectively receive and be held in electrical contact with said terminals of said first electronic part;
    a second connecting layer comprising a second electrically insulated sheet and a plurality of electrically conductive paths respectively passing through said second electrically insulated sheet obliquely, said electrically conductive paths having respectively first and second ends opposing to each other, said second ends of said electrically conductive paths being adapted to be respectively held in electrical contact with said terminals of said second electronic part and said second surfaces of said plurality of electrically conductive portions of said first connecting layer respectively held in electrical contact with said first ends of said electrically conductive paths, wherein
    a diameter of each of said first surfaces of said plurality of electrically conductive portions is in the range of 80% to 150% of that of respective one of said terminals of said first electronic part to ensure electrical connection between said first and second electronic parts.

2. A connector structure as set fort in claim 1, in which said first electrically insulating portion forming part of said first connecting layer is breathable and flexible.

3. A connector structure as set fort in claim 2, in which said first electrically insulating portion forming part of said first connecting layer is in the form of a mesh structure.

4. A connector structure as set fort in claim 1, in which said electrically insulating sheet forming part of said second connecting layer is made of synthetic resin or synthetic rubber.

5. A connector structure as set forth in claim 1, in which the a thickness of said electrically insulating sheet forming part of said second connecting layer is in the range of 0.3 to 1.0 mm.

6. A connector structure as set forth in claim 1, in which each of said first surfaces of said electrically conductive portions forming part of said first connecting layer is shaped so as to fittedly receive thereon and be held in electrical contact with a terminal of said first electronic part.

7. A connector structure as set forth in claim 6, in which each of said first surfaces of said electrically conductive portions forming part of said first connecting layer is in the form of a shape selected from a plane shape, a spherical concave shape, a conical concave shape, a crown shape, and a spherical shape.

8. A connector structure as set forth in claim 1, in which said first connecting layer is removably mounted on said second connecting layer, said first ends of said electrically conductive paths forming part of said second connecting layer are designed to be able to respectively receive thereon and be held in electrical contact with said terminal of said first electronic part when said first connecting layer is removed.

9. A connector structure as set forth in claim 8, in which said first ends of said electrically conductive paths are aligned and spaced apart from one another with respect to a first direction and a second direction perpendicular to said first direction so as to be respectively held in electrical contact with said terminals of said second electronic part.

10. A connector structure as set forth in claim 1, in which said first connecting layer is replaceable.

11. A connector structure as set forth in claim 10, in which said first connecting layer is replaceable with the first connecting layer comprising electrically conductive portions having first surfaces in the form of shapes so as to fittedly receive and be held in electrical contact with the terminals of the first electronic part.

12. A connector structure according to claim 3 wherein said first conductive portions second surface extends to at least said bottom surface of said first insulating portion.

13. A connector structure according to claim 1 wherein said first conductive portions first and second surfaces extend to beyond said top and said bottom surface of said first insulating portion.

* * * * *